(12) United States Patent
Nirschl et al.

(10) Patent No.: US 7,778,070 B2
(45) Date of Patent: Aug. 17, 2010

(54) MEMORY WITH DYNAMIC REDUNDANCY CONFIGURATION

(75) Inventors: Thomas Nirschl, Munich (DE); Thomas Happ, Dresden (DE); Jan Boris Philipp, Munich (DE)

(73) Assignee: Qimonda AG, Munich (DE)

( * ) Notice: Subject to any disclaimer, the term of this patent is extended or adjusted under 35 U.S.C. 154(b) by 144 days.

(21) Appl. No.: 12/120,946

(22) Filed: May 15, 2008

(65) Prior Publication Data

US 2009/0003046 A1   Jan. 1, 2009

Related U.S. Application Data

(60) Provisional application No. 60/947,301, filed on Jun. 29, 2007.

(51) Int. Cl.
*G11C 11/00* (2006.01)

(52) U.S. Cl. .................... 365/163; 365/148; 365/200

(58) Field of Classification Search .............. None
See application file for complete search history.

(56) References Cited

U.S. PATENT DOCUMENTS

| | | | |
|---|---|---|---|
| 6,584,589 B1 * | 6/2003 | Perner et al. ............. 714/721 |
| 7,457,145 B2 * | 11/2008 | Kund et al. ............. 365/148 |
| 7,606,111 B2 * | 10/2009 | Lee et al. ............. 365/238.5 |
| 2007/0217273 A1 * | 9/2007 | Choi et al. ............. 365/200 |
| 2008/0198674 A1 * | 8/2008 | Keller ............. 365/201 |
| 2009/0196092 A1 * | 8/2009 | Jagasivamani et al. ...... 365/163 |

* cited by examiner

*Primary Examiner*—Tan T. Nguyen
(74) *Attorney, Agent, or Firm*—Eschweiler & Associates, LLC

(57) ABSTRACT

One embodiment of the invention relates to a method for repairing a memory array. In the method, a group of at least one memory cell is dynamically analyzed to determine whether the memory array includes at least one faulty cell that no longer properly stores data. If the group includes at least one faulty cell, at least the at least one faulty cell is associated with at least another cell. Other methods, devices, and systems are also disclosed.

9 Claims, 10 Drawing Sheets

MEMORY WITH DYNAMIC REDUNDANCY CONFIGURATION

RELATED APPLICATION

This application claims priority to U.S. Provisional Application Ser. No. 60/947,301 filed Jun. 29, 2007, entitled "MEMORY WITH DYNAMIC REDUNDANCY CONFIGURATION."

FIELD OF INVENTION

The present invention relates generally to semiconductor devices and more particularly to improved methods and systems for semiconductor memories.

BACKGROUND OF THE INVENTION

Several trends presently exist in the semiconductor and electronics industry. One of these trends is that recent generations of portable electronic devices are using more memory than previous generations. This increase in memory allows these new devices to store more data, such as music or images, and also provides the devices with more computational power and speed.

One type of memory device includes an array of resistive memory cells, where individual bits of data can be stored in the individual resistive memory cells of the array. Depending on how the cell is biased, it can be switched between a more resistive state or a less resistive state. In real world-implementations, the more resistive state can be associated with a logical "1" and the less resistive state can be associated with a logical "0", or vice versa. Additional resistive states could also be defined to implement a multi-bit cell with more than two states per cell. Therefore, by switching between the resistive states, a user can store any combination of "1"s and "0"s in the array, which could correspond to digitally encoded music, images, software, etc.

In resistive memories, the characteristics of the memory cells may drift over time. For example, cells that are accessed much more than average may tend to exhibit data failures. Because some applications may not tolerate data errors, the failure of these individual cells seriously limits the failure rate of the memory device. Therefore, a need has arisen to provide systems and methods relating to memory devices that can account for faulty cells.

SUMMARY OF THE INVENTION

One embodiment of the invention relates to a method for repairing a memory array. In the method, a group of at least one memory cell is analyzed to determine whether the group includes at least one faulty cell that no longer properly stores data. If the group includes at least one faulty cell, at least the at least one faulty cell is dynamically associated with at least another cell. Other methods, devices, and systems are also disclosed.

DETAILED DESCRIPTION OF THE INVENTION

Figure 1:
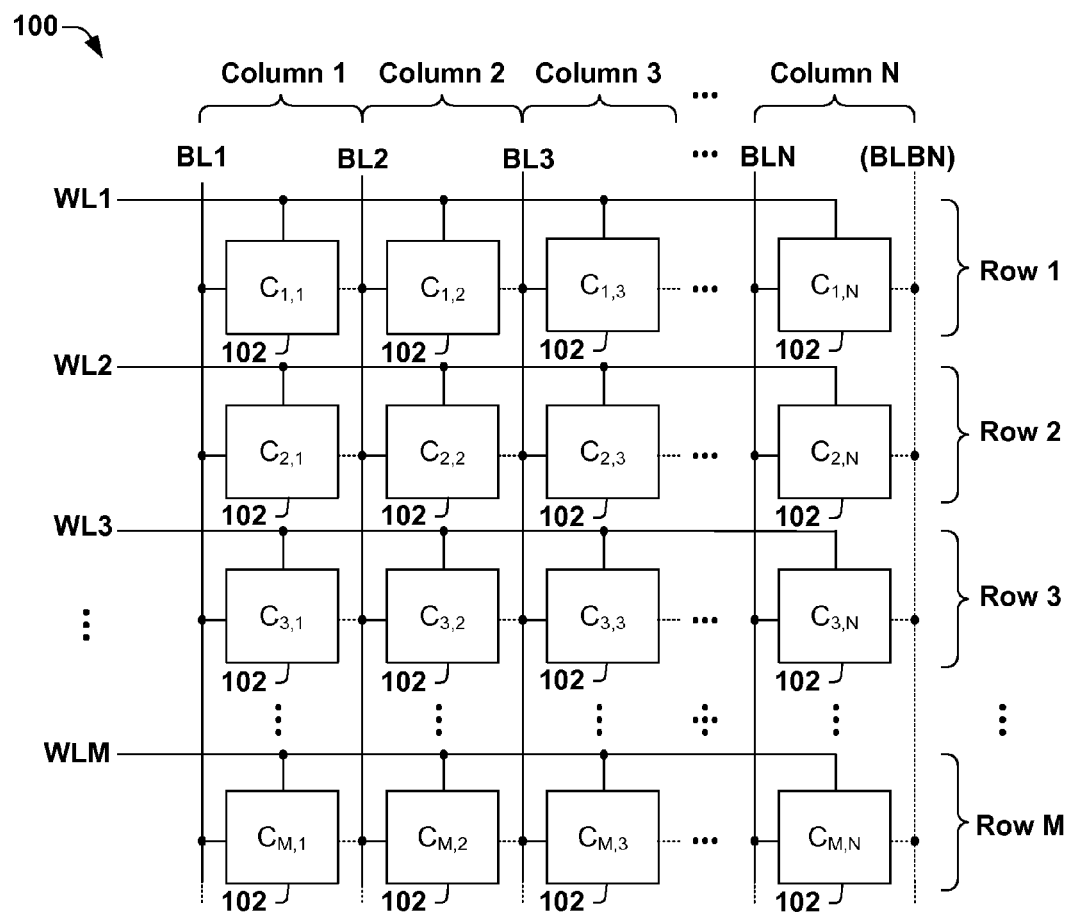
FIG. 1 shows one embodiment of a memory array.

One or more implementations of the present invention will now be described with reference to the attached drawings, wherein like reference numerals are used to refer to like elements throughout. The drawings are not necessarily drawn to scale. Although various illustrated embodiments are described and illustrated as a hardware structure, the functionality and corresponding features of the present system can also be performed by appropriate software routines or a combination of hardware and software.

Although several embodiments are illustrated and discussed below in the context of resistive or phase-change memories, aspects of the present invention could also relate to other types of memory devices and methods associated therewith. Some examples of illustrative types of resistive memory include: perovskite memory, binary oxides random access memory (OxRAM), phase change random access memory (PCRAM), conductive bridging random access memory (CBRAM), and polymer memory. Other types of memories that are contemplated as falling within the scope of the invention include: random access memories (RAM), static random access memories (SRAM), dynamic random access memories (DRAM), read only memory (ROM), ferroelectric memories, flash memory, EEPROM, and EPROM.

Referring now to FIG. 1, one can see a somewhat conventional memory array 100 that includes a number of memory cells 102 that are each capable of storing one or more bits of data, depending on the implementation. The cells 102 are arranged in M rows (e.g., words) and N columns (e.g., bits), indicated as $C_{ROW\text{-}COLUMN}$. Each row of cells is an N bit data word accessible by activation of a wordline WL associated with that row. For example, in the first row of the array 100, the cells $C_{1,1}$ through $C_{1,N}$ form an N bit data word that may be accessible by activation of wordline WL1 via bitlines BL1 through BLN. Generally speaking, while the wordline is asserted, data values can be read from or written to the cells in the corresponding row by properly biasing the bitlines.

Depending on the implementation, each column of cells can be accessed via a single bitline or via a pair of bitlines. For example, in one embodiment the array could be configured in a single-ended configuration, where a single bitline is coupled to each column of cells. For example, in the first column, the cells $C_{1,1}$ through $C_{M,1}$ would be coupled to BL1 (corresponding to the solid line to the left of each cell). In this configuration, a sense amp (not shown) could, for example, read a data-value from the cell by comparing a voltage or current on the bitline of accessed cell to that of a similar bitline of a reference cell.

By contrast, in another embodiment, the array could be configured in a differential configuration, where two complimentary bitlines are coupled to each column of cells. For example, in column 1, the cells $C_{1,1}$ through $C_{M,1}$ could be coupled to BL1 and BL2 (corresponding to the solid lines and dashed lines extending from the cells), which bitlines would tend to carry complimentary values (e.g., BL1 could represent a logical "0" and BL2 could represent a logical "1"). In this configuration, a sense amp typically reads data from an accessed cell by measuring a voltage or current bias between the pair of complimentary bitlines.

Figure 1A:
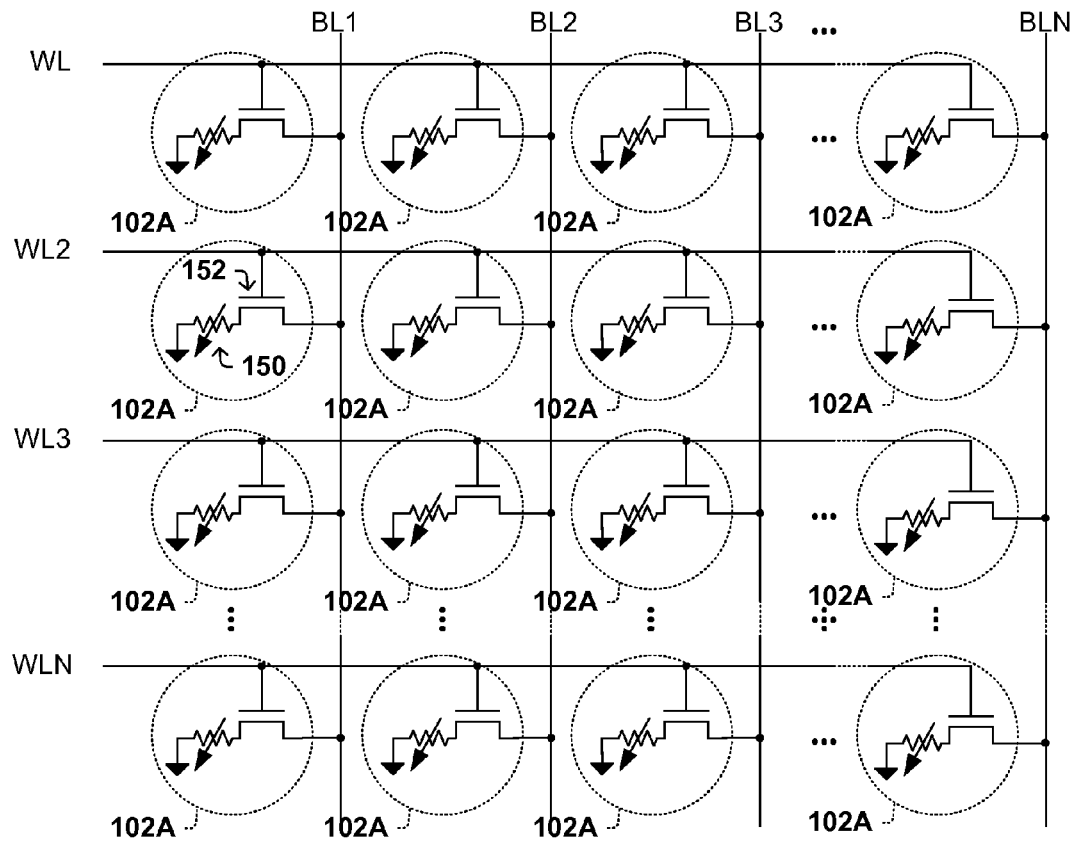
FIG. 1A shows one embodiment of an array of resistive memory cells configured in a single ended configuration.

FIG. 1A shows a more detailed embodiment of a single ended configuration of an array 100A of resistive memory cells 102A, such as phase change memory cells. In the illustrated embodiment, each memory cell includes a resistive element 150 (e.g., a layer of programmable material), and an access transistor 152. In other non-illustrated embodiments, a diode could be substituted in place of each access transistor 152, located in series between the memory resistor and the word line.

Figure 2:
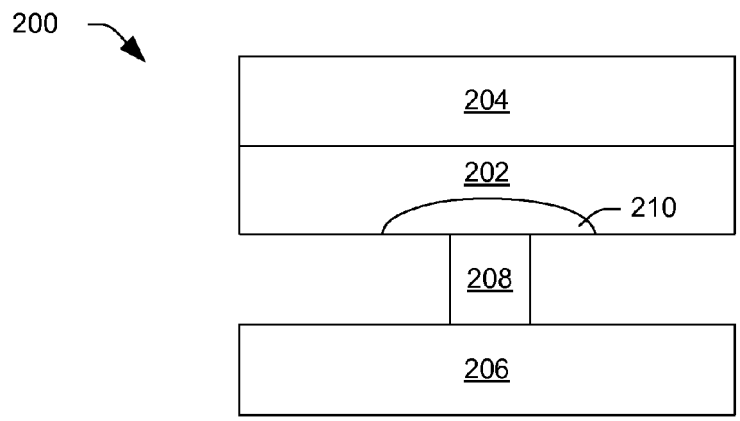
FIG. 2 shows one embodiment of a phase-change memory cell.

In this embodiment, the resistive elements 150 could comprise phase change elements, such as the phase change element 200 shown in FIG. 2. The phase change element 200 includes a layer of programmable material 202 (e.g., a polycrystalline chalcogenide material, such as GeSbTe or an SbTe compound, or a chalcogenide-free material, such as GeSb or GaSb) that is positioned between a top electrode 204 and a bottom electrode 206. In the illustrated embodiment, the bottom electrode 206 includes a heater member 208 that can, by means of an appropriate pulse configuration, place a programmable volume 210 of the programmable material in either an amorphous-state (i.e., relatively-high resistance state) or a crystalline state (i.e., relatively-low resistance state). These states could then be assigned to corresponding data states—for example, the amorphous-state could be assigned to a logical "0" and the crystalline-state could be assigned to a logical "1", or vice versa. In various embodiments, additional resistance states could be associated with corresponding data states to implement a multi-bit cell with more than two states per cell.

Figure 3:
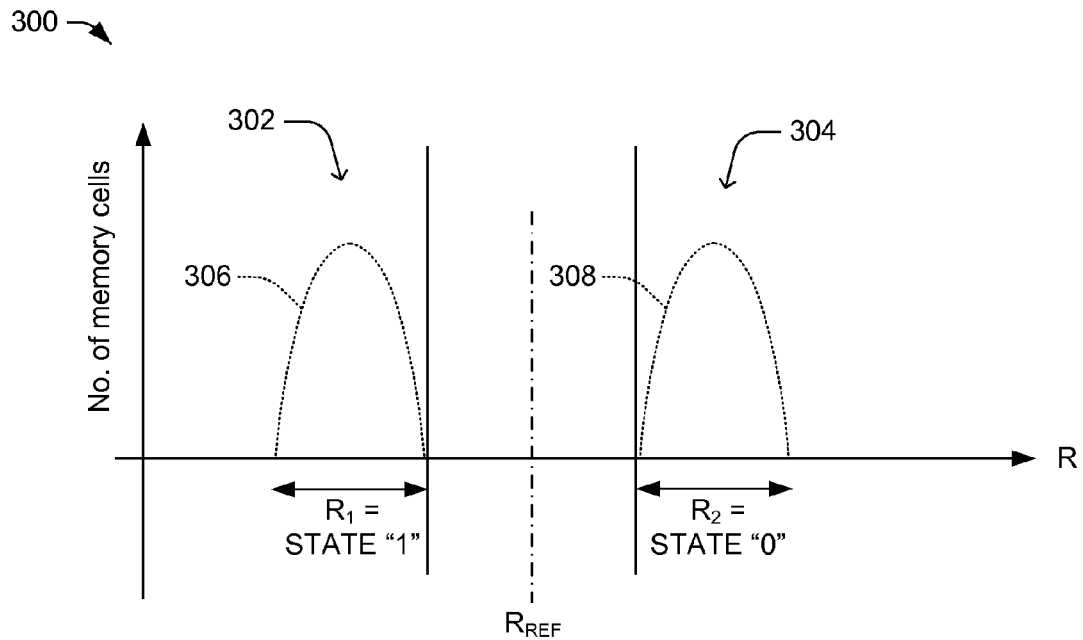
FIG. 3 shows one embodiment of a favorable resistance distribution that relates to an array of binary resistive memory cells.

Because of slight variations between the memory cells of the array, the programmed resistances of the cells can vary across the array. Thus, FIG. 3 shows a favorable resistance distribution 300 for a memory array of binary phase change memory cells, where there are two distinct resistance ranges 302, 304. Each "reliable" cell of the array has a resistance that tends to fall on one of the bell-shaped distributions 306, 308, such that some reliable cells 306 tend to be in a "1" state (i.e., in reliable resistance range 302) while others cells 308 tend to be in a "0" state (i.e., in reliable resistance range 304). Because there is sufficient margin between the two states 302, 304, the sense amp can accurately read from these reliable cells. For example, in one embodiment, a sense amp could read an accessed cell by comparing the cell's resistance to a reference resistance $R_{REF}$ that represents a resistance of a reference memory cell, which is not in a "1" state or a "0" state.

Figure 4:
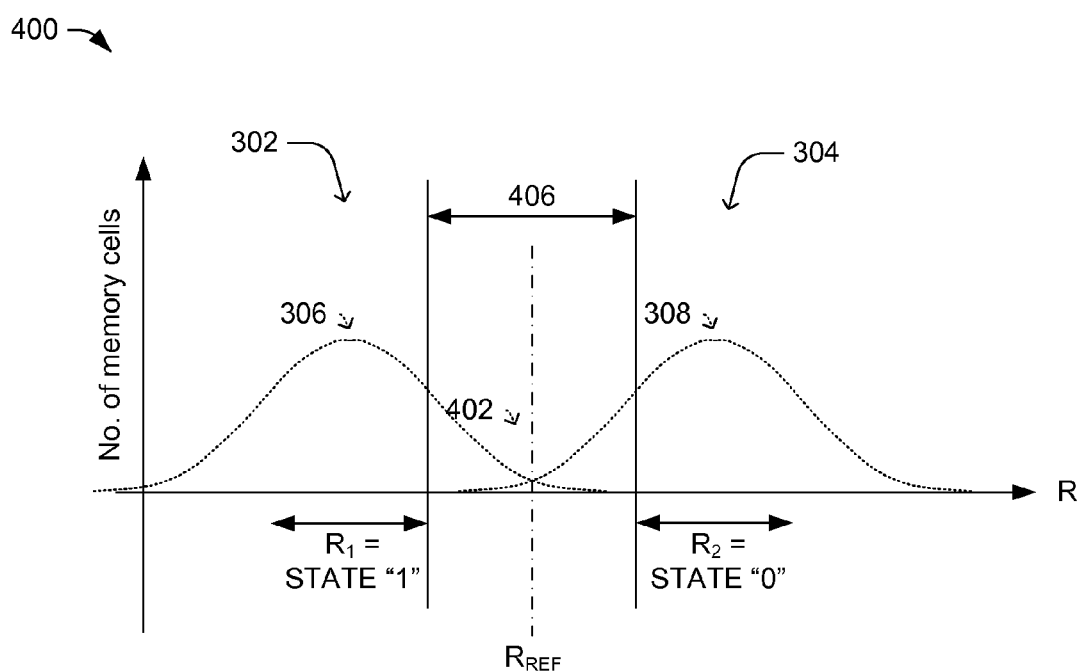
FIG. 4 shows one embodiment of an unfavorable resistance distribution that relates to an array of binary resistive memory cells.

Due to some cells being accessed more frequently than other cells, for example, the resistances of the cells may tend to drift over time. As shown in FIG. 4, in such a case the cells of the array can tend towards an unfavorable distribution 400. In this unfavorable distribution 400, faulty cells of the array have resistances 402 that tend to fall within the disallowed regions 406, which surround the reliable ranges 302, 304. Those cells may fail to have sufficient noise margin, or even create overlapping resistance distributions. Because these faulty cells no longer have a resistance that is recognizable, these faulty cells provide unreliable data. In some embodiments, the faulty cells are damaged or corrupted to such an extent that they can no longer store data properly. In such a case, these faulty cells may render the memory unusable for practical purposes, and the user will have to discard the memory and any data processing system in which the memory is embedded.

To mitigate the effects of these faulty cells and increase the useful lifetime of the memory and any associated data processing system, aspects of the present invention relate to methods and systems for dynamically analyzing the cells of the array over the lifetime of the device to determine if the array includes faulty cells. If the array does include faulty cells, the memory associates the faulty cells with other non-faulty cells, thereby mitigating data loss due to the faulty cells. For example, in one embodiment, the memory can use a look-up table to map an address range associated with any faulty cells to a new address range in a redundant memory. Accordingly, the inventors have devised methods, systems and devices for self-repairing memories.

Figure 5:
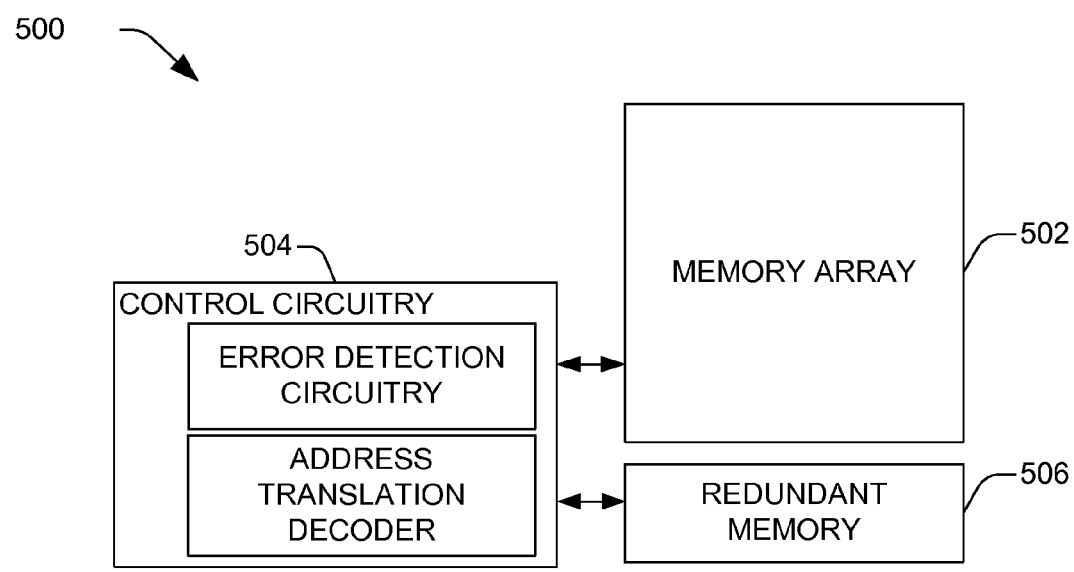
FIG. 5 shows one embodiment of a memory device that includes redundant memory.

Referring now to FIG. 5, one can see a memory device 500 that is configured to account for faulty cells. The memory device 500 includes a memory array 502 (such as previously discussed array 100), control circuitry 504, and redundant memory 506.

The redundant memory 506 includes redundant memory cells that are often reserved to replace any faulty memory cells. Typically, the redundant memory is a scratchpad sector within the memory array 502, but in other embodiments the redundant memory could be a separate memory array formed on the same semiconductor body as the memory array, an off-chip memory device (DRAM, SRAM, Flash, EEPROM, EPROM, etc.), or some other type of memory (e.g., registers). The redundant memory 506 may comprise volatile or non-volatile memory cells, such as those mentioned herein.

To provide desired functionality, the control circuitry 504 is configured to detect faulty bits within the memory array 502 and map an address range associated with any faulty bits to an address range of corresponding size within the redundant memory 506. More detailed functionality of these blocks in various embodiments will be appreciated with reference to the methods below.

Figure 6:
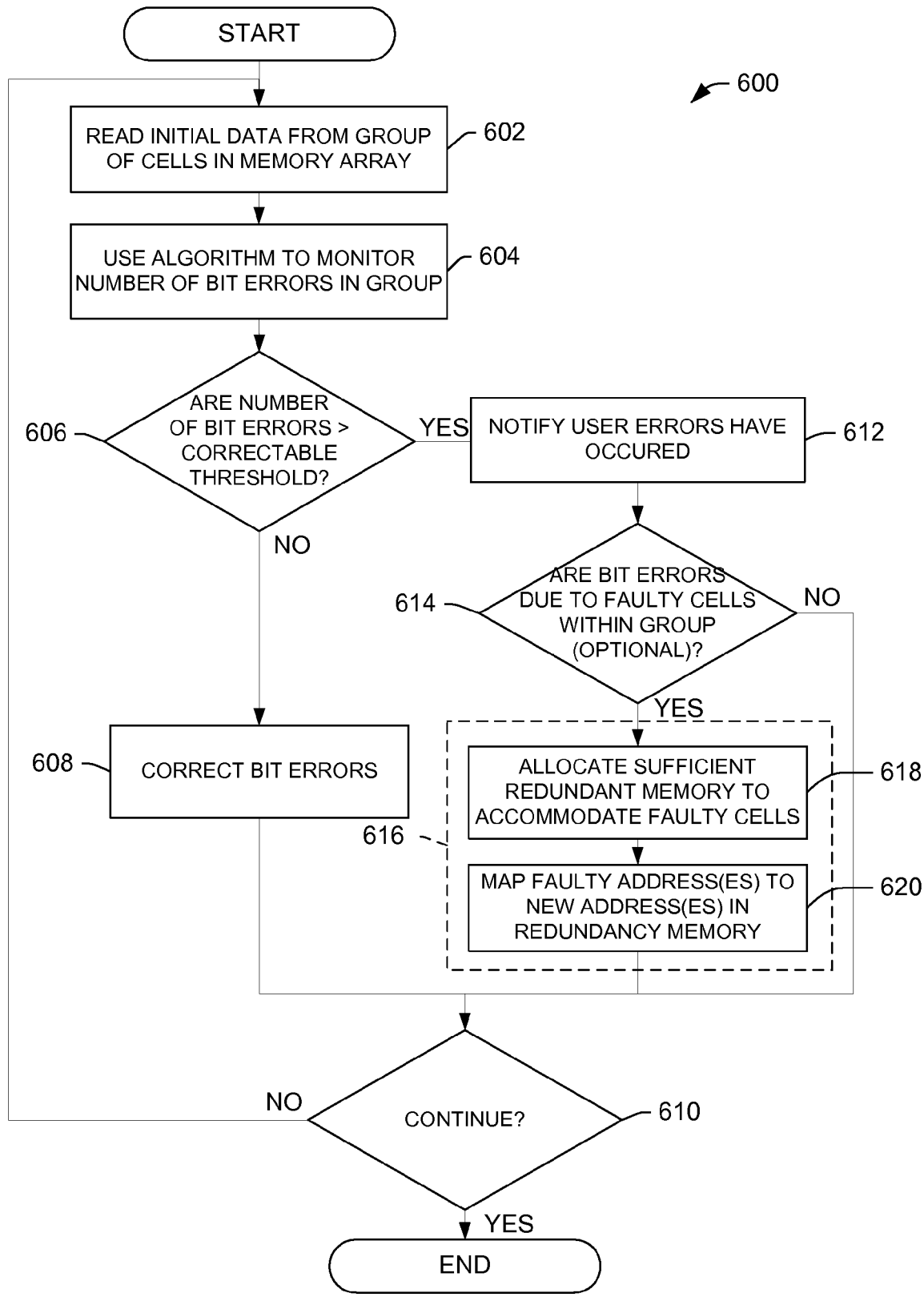
FIG. 6 shows one flowchart of a memory repair operation.
Figure 7:
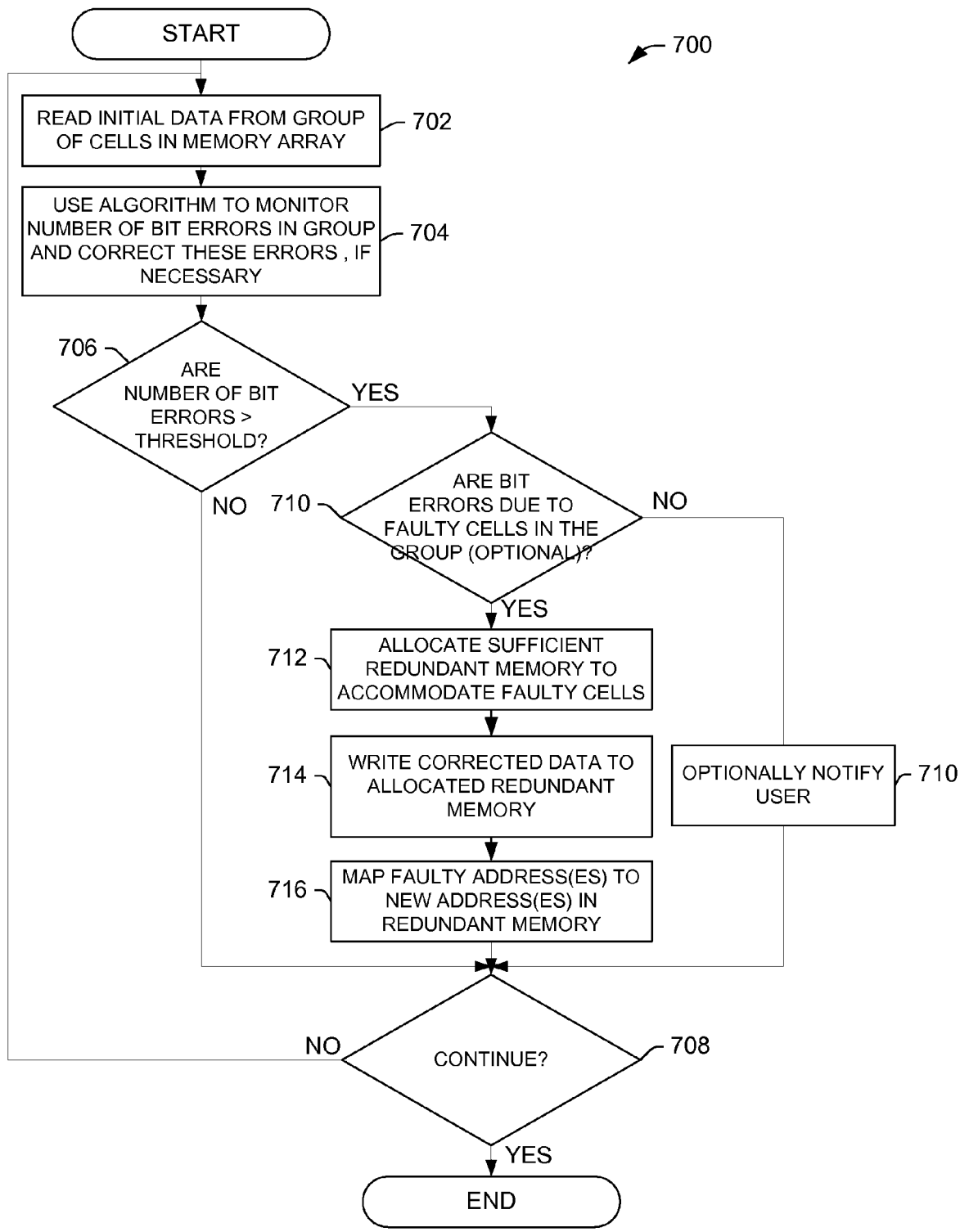
FIG. 7 shows another flowchart of a memory repair operation.
Figure 8:
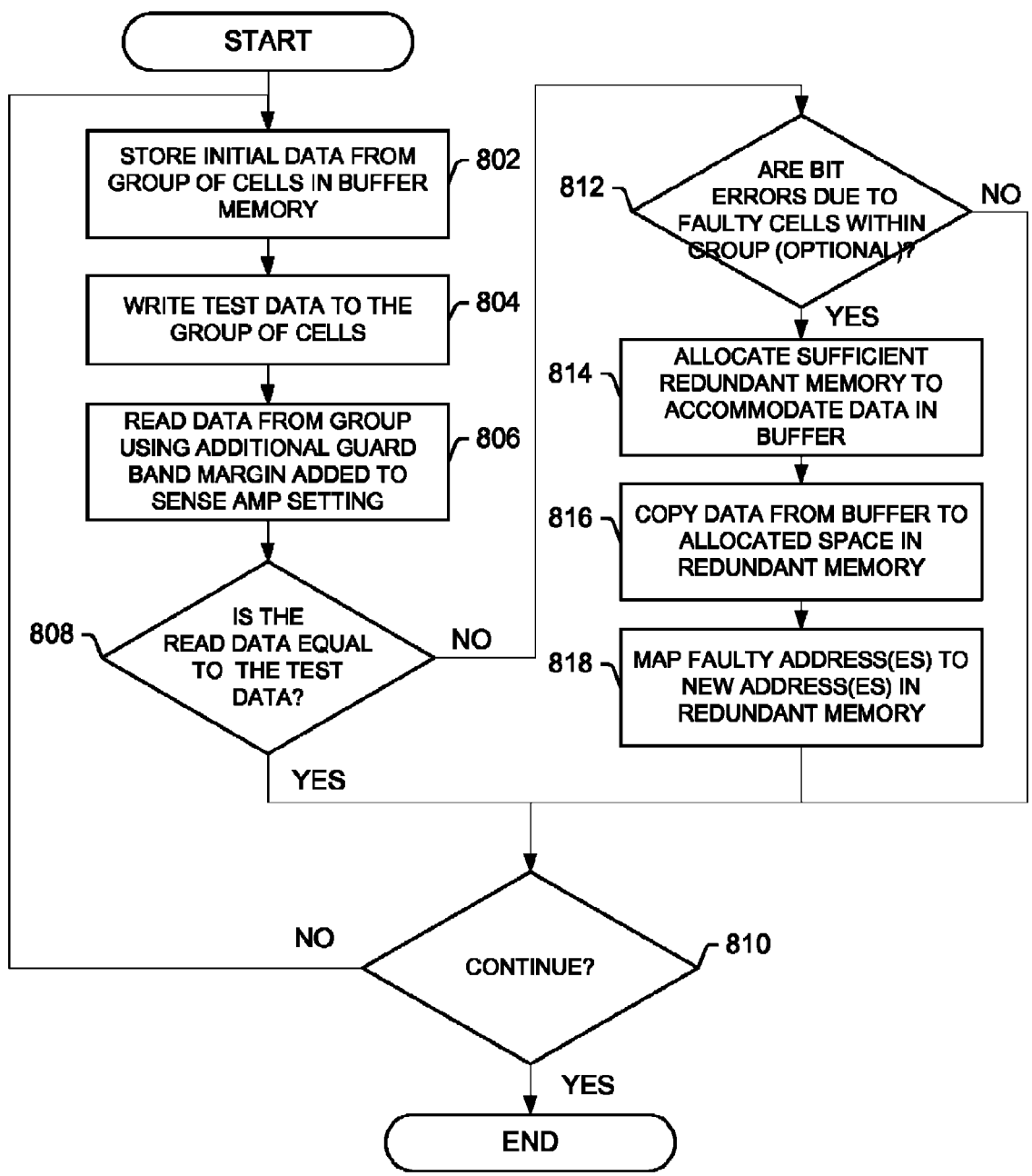
FIG. 8 shows another flowchart of a memory repair operation.

In order to further appreciate various aspects of the invention, several illustrative methods (600, 700, 800) are now set forth below with reference to several flowcharts (FIG. 6, FIG. 7, and FIG. 8, respectively). Although these methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated (e.g., memory device 500 in FIG. 5) and described herein as well as in association with other structures not illustrated.

Typically, these methods 600, 700, 800 move from one group of memory cells within the array to another group within the array, while checking the data within each group for errors. If the data within a group contains an error, then a dynamic redundancy procedure may be performed to effectively replace any faulty cells. In various embodiments, these methods may be done during normal read operations, but in other embodiments they may be performed in a dedicated test mode. In some embodiments while these methods are running on the memory device, the memory device may provide a "busy" signal on its bus so that other programs do not access the memory device during checking. In various embodiments, a user could prompt the memory device to initiate these methods.

Referring now to FIG. 6, one can see method 600, which periodically checks groups of cells within the array for errant data and corrects the errant data to the extent possible. When the errant data can no longer be corrected (i.e., after uncorrectable errors have occurred), the method determines whether the errors are due to faulty cells that no longer store data properly. If so, it reconfigures the memory device so the faulty cells are mapped to redundant cells in the redundant memory.

More specifically, at block 602 initial data is read from a group of cells in the memory array. As used in this specification, a group could comprise one or more bits, one or more nybbles, one or more bytes, one or more words, one or more blocks, one or more sectors, one or more pages, the entire memory array, or any other number of memory cells.

At block 604, an algorithm is used to monitor the number of bit errors in the group. Illustrative algorithms could include error correction checking (ECC) or error detection and correction (EDAC), which are techniques based on Hamming or Read-Solomon codes in which redundant bits are added to the group, such that a corrupted group with a single bit-error shows a pattern that unambiguously points to the single corrupted bit. These redundant bits could be stored, for example, in a scratchpad sector with in the memory device or within the memory array 502. In other embodiments, other algorithms could be used. For example, the algorithm could also utilize a parity checking bit, which does not typically have error correction capabilities.

In one ECC implementation, if a group includes $2^N$ bits (where N=0 or any positive integer), 2*N redundancy bits could be stored. These redundancy bits could be used to detect any errors within the group, and identify and correct single bits errors within the group. For example, if a 32-bit (i.e., $2^5$ bits) group size is selected, 10 redundancy bits (i.e., 2*5 redundancy bits) could be stored. If a single-bit error occurs, these bits could then identify the single errant bit and correct it. If a multi-bit error occurred, these bits could notify the user of the error or take other appropriate action. While more redundancy bits per a given group size tend to offer greater error protection, these redundancy bits would also tend to reduce device performance by adding additional computing overhead. Therefore, there is typically a tradeoff between performance and the ability to correct bit errors.

At block 606, an optional determination is made as to the number of bit errors is greater than the number of bits that the algorithm can correct (i.e., a correctable threshold). As can be discerned from the above discussion, the correctable threshold is often a function of the specific algorithm used. If the number of bit errors is less than the corruption threshold ("NO" at 606), then the errors are corrected in block 608. From 608, the method proceeds to block 610 where a determination is made as to whether another group is to be read or tested.

If, however, the number of bit errors is greater than the correctable threshold ("YES" at 606), the method may proceed to 612 and notify the user that errors have occurred.

The method then proceeds to block 614 and optionally determines whether the bit errors are due to faulty cells that can no longer provide reliable data. This could be accomplished, for example, by repeatedly writing test data to the group of cells and reading data back from the cell to ensure that the errant data is not just due to an anomaly (e.g., an alpha particle or other radiation striking the cell and causing the errant data). If the errant data is not the result of a faulty cell ("NO" at 614), the user could be notified, but the group being read or tested may still be used for future accesses.

By contrast, if the bit errors are due to faulty cells that can no longer provide reliable data ("YES" at 614), the method initiates a redundancy configuration 616, which associates the group of cells (or just the faulty cells within the group) with corresponding redundant cells in the redundant memory.

At block 618, the redundancy configuration starts when the process allocates a sufficient number of redundant memory cells to accommodate the faulty cells or group of cells. In one embodiment, the process could allocate precisely enough redundant cells to accommodate only the faulty cells, while in other embodiments the process could allocate enough cells to accommodate the entire group being accessed. For example, if the accessed group consisted of a word (e.g., 32 bits) that contained 1 faulty cell (e.g., 1 bit), in one embodiment the process could allocate only a single bit (e.g., 1 bit) in the redundancy memory, while in other embodiments the process could allocate an entire word (e.g. 32 bits) in the redundancy memory. In typical embodiments, the entire word would be allocated (as opposed to the single bit) to make the addressing more streamlined. Also in this block 618, if there is insufficient memory available in the redundant memory, an error could be flagged for the user. In one embodiment, both the redundant memory cells and the address mapping information are stored in a special area of the array 502 reserved for such information.

At block 620, after sufficient redundant memory has been allocated, the address range of the faulty cells is mapped to a new address range in the redundant memory. Typically, this could be facilitated by the use of a table-lookup, where the control circuitry retains a table that cross-references the address range of the faulty cells and the new address range in the redundant memory. Therefore, although a user may provide the control circuitry with an address corresponding to the faulty cells, the control circuitry will automatically access the new address range within the redundant memory. Thus, according to one implementation, the transition between faulty cells and the redundant memory is seamless to a user.

In one embodiment, this table-lookup could be implemented as a bank of registers or other memory elements in the memory device. When faulty cells are detected, an address corresponding to these faulty cells could then be stored in this bank of registers. When a user accesses the memory array, the address decoder or other control circuitry could compare the user-supplied address to the addresses stored in the look-up table. If the user-supplied address corresponds to a faulty address, then the memory device automatically accesses the cells in the redundant memory as indicated by the table-lookup.

Referring now to FIG. 7, one can see another method 700 in accordance with aspects of the present invention. Generally speaking, this method 700 checks groups of cells within the array for errors during normal read operation and corrects errors to the extent possible. However, unlike method 600, this method 700 determines if the errors are due to faulty cells just before the errors become uncorrectable. If these correctable errors are due to faulty cells, the method maps the faulty cells to corresponding redundant cells before any errors are incurred. In the illustrated embodiment, this is achieved by triggering the mapping based on whether the number of bit errors is somewhat less than the correctable threshold associated with the group.

In block 702, initial data is again read from a group of cells in the memory array. Next, in block 704, an algorithm, such as those noted above, is used to monitor the number of bit errors in the group. These errors are corrected to the extent possible.

In block 706, a determination is made as to whether the number of bit errors is greater than a threshold, where this threshold is somewhat less than the correctable threshold associated with the group of cells under test. For example, if an ECC algorithm is employed that could correct up to 4 bits per group, the threshold could be set to 3 bits. If the number of bit errors are less than this threshold ("NO" at 706), the errors have been corrected and the method 700 proceeds to 708, where another group may be read or tested.

If the number of bit errors is greater than the threshold ("YES" at 706), the method proceeds to 710. Thus, if the array has cells that slowly degrade into faulty cells, the number of bit errors should increase relatively slowly. By setting the threshold just below the number of correctable bits, a user can still use the cells for as long as reasonably possible, but can then switch to the redundant cells before data errors occur.

In 710, an optional determination is made as to whether the bit errors are due to faulty cells in the group or due to an anomaly, for example. If the errors are not due to faulty cells ("NO" at 710), the memory device can continue to use the group of cells in the array, although the method may optionally notify the user that errant data may be likely to ensue.

If the bit errors are due to faulty cells ("YES" at 710), in block 712 the method allocates sufficient redundant memory to accommodate the faulty cells (or the group under test).

In block 714, the corrected data to be written to the faulty cells is written to the allocated redundant memory. Lastly, in 716, the address range associated with the faulty cells is mapped to a new address range in the redundant memory. Thus, in this scenario, all data errors have typically been corrected, and the redundant memory cells will be switched in "just in time" to avoid errors.

Referring now to FIG. 8, one can see still another method 800 that can detect weak cells by writing data into cells, and then checking this data by employing additional guard band margin. This method 800 allows weak cells to be replaced before errors occur.

In block 802, initial data from a group of cells is stored in a buffer memory, which could be, for example, an off-chip memory device, a scratchpad sector within the memory array or redundancy memory, or memory somewhere else in the device or system.

In block 804, test data is written to the group of cells.

In block 806, data is read from the group. In one embodiment, this read is performed using additional guard band margin added to the sense amp setting (see e.g., FIG. 9 and accompanying discussion below).

Next in block 808, the read data is compared to the test data that was previously written to the cell. Ideally, if the cells in the group are non-faulty, one would expect the read data to equal the test data. Thus, in one embodiment, this comparison could comprise a logical XOR or XNOR function, such that if any read bits differ from corresponding test bits then any errant bits can be uniquely identified. Other algorithms, such as those previously discussed could also be used to make this comparison.

If the read data favorably compares to the test data ("YES"), the cells are deemed sufficiently reliable at this time and the method proceeds to 810 another group can be read or tested. By contrast, if the read data does not favorably compare with the test data ("NO" at 808), the method proceeds to block 812.

In block 812, an optional determination is made as to whether the bit errors are due to faulty cells within the group or merely due to anomalies affecting the cell. In one embodiment, this could be achieved by repeatedly carrying out blocks 802-808. Thus, if the read data is consistently different from the test data, the cells associated with the errant bits are deemed to be faulty. By contrast, if the read data is consistently the same as the test data (notwithstanding a one-time error), the method may determine that an anomaly has occurred and can continue to use the cells.

If the bit errors are due to faulty cells within the group ("YES" at 814), the method again allocates sufficient redundant memory to accommodate the initial data that is now stored in the buffer. If there is insufficient memory, the method can flag an error. Assuming there is sufficient memory, in block 816, the method can write the data from the buffer to the allocated space in the redundant memory. In block 818, the method can map the address range of the faulty cells to a new address range in the redundant memory as previously described.

Figure 9:
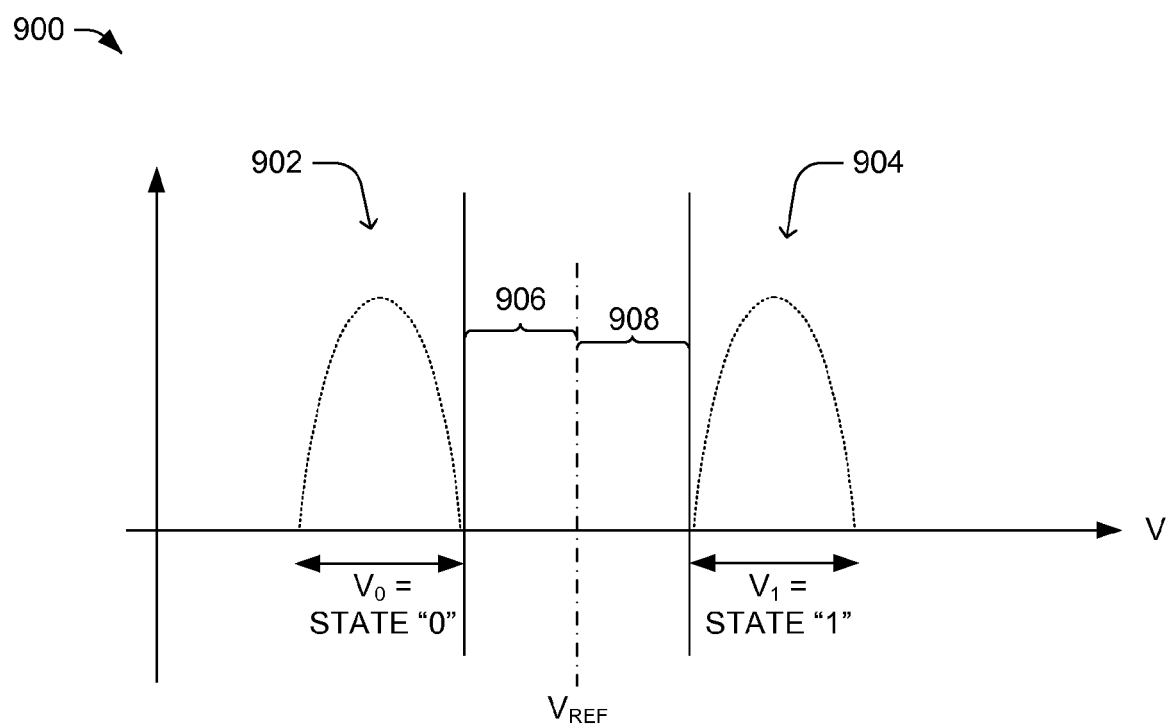
FIG. 9 shows a schematic representation of a one aspect of one embodiment of a memory repair operation.

FIG. 9 shows a more detailed embodiment of how additional guard band margin could be used to detect weak cells that may be tending towards a faulty cell. As shown, when data is typically read from a cell, a voltage is developed on the bitline associated with the cell, which voltage is proportional to the resistance of the memory cell. Thus, in FIG. 9, a voltage distribution 900 of the cells of the memory array is illustrated, where the cells have voltages falling within reliable voltage ranges 902, 904 corresponding to a "0" state or a "1" state, as shown. Generally, a sense amp compares the voltage from the cell to the reference voltage $V_{REF}$, and thereby determines whether the accessed cell is in the "1" or "0" state. During the read with increased guard band margin (see FIG. 8, block 806), upper and lower guard band margins (906, 908 respectively) can be moved further from the reference voltage $V_{REF}$ relative to normal operational reads. Thus, the individual memory cells of the array are subjected to a more rigid distribution. Accordingly, weak cells that fall near the edges of the reliable voltage ranges 902, 904, can be identified. Often these weak cells still provide accurate data, and can therefore be mapped to redundant cells, if desired, before errors occur.

In various embodiments, the memory device could be a doubly redundant memory device or an even more redundant memory device. For example, in a doubly redundant memory device, the methods discussed above (or other methods) run not only on the memory array (first redundancy), but also run on the redundant memory as it is allocated (second redundancy). Accordingly, if a redundant memory cell becomes faulty, it can be replaced by another redundant memory cell (or some other memory cell) to again repair the memory device.

Figure 10:
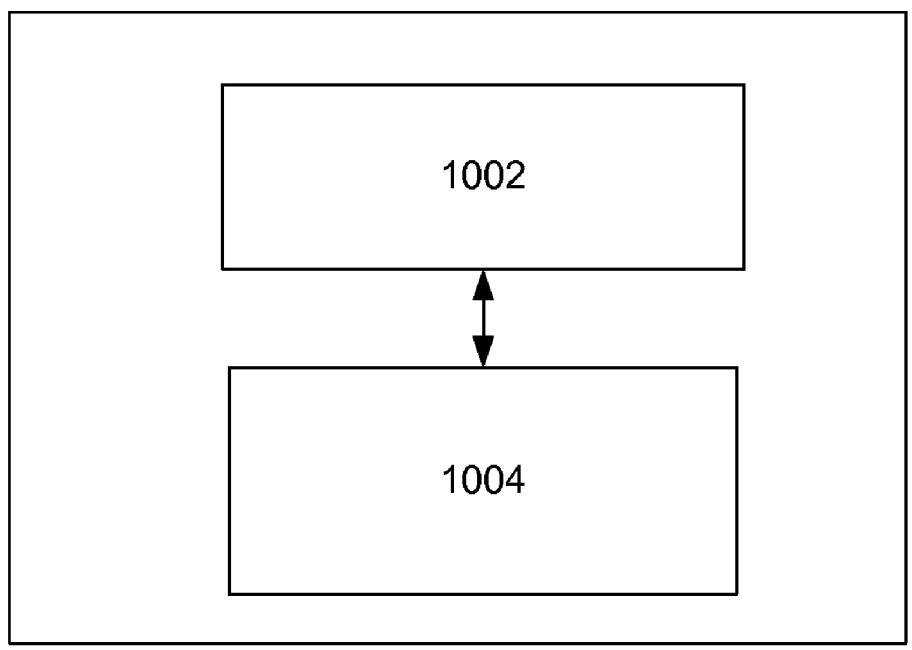
FIG. 10 is a block diagram of a data processing system in which exemplary memory devices may be utilized.

FIG. 10 shows an embodiment of a data processing system 1000 that comprises data processing circuitry 1002 configured to process data; and a memory device 1004 for storing the data. The memory device may be any memory device as described herein. For example, in one embodiment, the memory device 1004 can include an array of phase change memory cells. In one embodiment the data processing system 1000 could be a communication device, such as a cell phone or pager, for example. In other embodiments, the data processing system 1000 could be a portable electronic product, such as a portable computer, cell phone, pager, camera, music device, voice recorder, etc. In still other embodiments, the data processing system 1000 could comprise an electronic system, such as a car, plane, industrial control system, etc.

Figure 11:
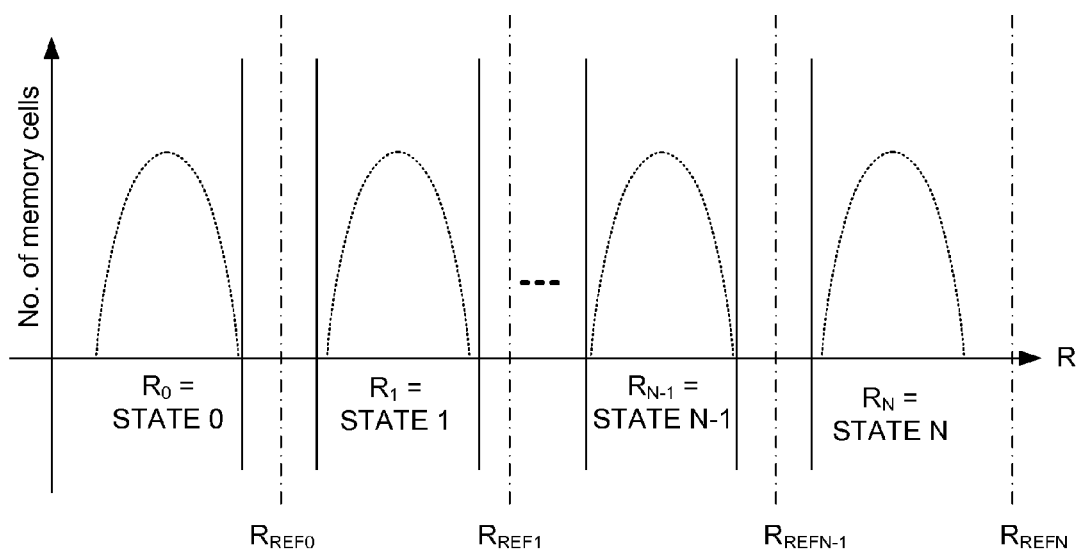
FIG. 11 shows one embodiment of a resistance distribution that relates to an array of multi-bit resistive memory cells.

While one embodiment of a binary phase change memory cell has been discussed for convenience and clarity, aspects of the present invention also relate to multi-bit memory cells (e.g., multi-bit phase change memory cells, multi-bit flash cells, multi-bit resistive cells, etc.), such as more than 2 levels stored by one physical memory cell, i.e. 1.5 bits/cell. FIG. 11 shows a resistance distribution of the multi-bit cell, which again shows one general scheme in which a range of resistances can be divided into a number of reliable resistance ranges. These multi-bit memory cells could also drift from the favorable distribution, creating faulty cells as described above.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device, comprising:
   an array of resistive memory cells formed on a semiconductor body;
   control circuitry configured to use a first sense amp level to read data from the memory cells of the array, and to use a second sense amp level that is different than the first sense amp level to detect weak memory cells within the array.

2. The memory device of claim 1, further comprising:
   redundant memory cells that are reserved for replacement of some of the resistive memory cells of the array;
   where the control circuitry is further configured to dynamically associate the weak cells with the redundant memory cells.

3. The memory device of claim 2, where the redundant memory cells of the redundant memory comprise resistive memory cells of the array.

4. The memory device of claim 2, where the redundant memory cells of the redundant memory comprise memory elements that are external to the memory array.

5. The memory device of claim 1, where the memory cells comprise phase-change memory cells.

6. A method for maintaining an array of resistive memory cells, where a number of reliable resistance ranges is associated with the array and each reliable resistance range corresponds to a different data state, comprising:
   providing control signals to analyze whether a group of at least one resistive memory cell of the array includes at least one weak cell that has a resistance within one of the reliable resistance ranges, but near an edge of the one reliable resistance ranges; and
   if the group includes at least one weak cell, then dynamically associating the at least one weak cell with at least another memory element.

7. The method of claim 6, where analyzing whether the group includes at least one weak cell comprises:
   reading from the group of at least one resistive memory cell by using a second sense amp level that is different from a first sense amp level used during normal read operations; and
   triggering the dynamic association based on whether a number of bit errors read with the second sense amp level is greater than a threshold value.

8. The method of claim 7, where associating at least the at least one weak cell with at least another memory element, comprises:
   mapping at least one address corresponding to at least the at least one weak cell to at least one new address in a redundant memory.

9. The method of claim 8, where the memory cells of the memory array comprise phase-change memory cells.

* * * * *